(12) United States Patent
Liu et al.

(10) Patent No.: US 6,747,511 B1
(45) Date of Patent: Jun. 8, 2004

(54) DISTRIBUTED AMPLIFIER WITH PI-CONFIGURATION ANALYSIS AND SYNTHESIS LINES

(75) Inventors: Cheh-Ming Jeff Liu, Thousand Oaks, CA (US); Neng-Haung Sheng, Thousand Oaks, CA (US)

(73) Assignee: Euvis, Inc., Westlake Village, CA (US)

( * ) Notice: Subject to any disclaimer, the term of this patent is extended or adjusted under 35 U.S.C. 154(b) by 0 days.

(21) Appl. No.: 10/144,292

(22) Filed: May 13, 2002

Related U.S. Application Data
(60) Provisional application No. 60/292,487, filed on May 21, 2001.

(51) Int. Cl.[7] .................................................. H03F 3/60
(52) U.S. Cl. ..................... 330/53; 330/54; 330/124 R
(58) Field of Search .......................... 330/53, 54, 124 R

(56) References Cited

U.S. PATENT DOCUMENTS

| | | | |
|---|---|---|---|
| 5,227,734 A | * | 7/1993 | Schindler et al. ............ 330/54 |
| 5,550,513 A | | 8/1996 | Wong |
| 5,559,472 A | | 9/1996 | Kobayashi |
| 5,751,190 A | | 5/1998 | Nguyen et al. |
| 5,920,230 A | | 7/1999 | Beall |
| 6,094,099 A | | 7/2000 | Kobayashi |

FOREIGN PATENT DOCUMENTS

| | | |
|---|---|---|
| GB | 460562 | 1/1937 |
| JP | 354136259 | * 10/1979 |

OTHER PUBLICATIONS

Moazzam et al. "A high gain dual–fed single stage distributed amplifier" IEEE MTT–S International Microwave Symposium Digest 1994 May 23–27, 1994 pp 1409–1412 vol. 3.*

* cited by examiner

*Primary Examiner*—Michael B Shingleton
(74) *Attorney, Agent, or Firm*—Michael Blaine Brooks, P.C.; Michael B. Brooks

(57) ABSTRACT

A distributed amplifier for wide-band, high power application is disclosed. The amplifier consists of an analysis module, a gain module and a synthesis module. In the analysis and synthesis modules, inductors such as transmission lines are connected to gain elements of the gain modules with a newly disclosed "pi" configuration, by which the number of inductors, or transmission lines, is reduced. This invention may be applied to wide-band and high-speed communications.

4 Claims, 5 Drawing Sheets

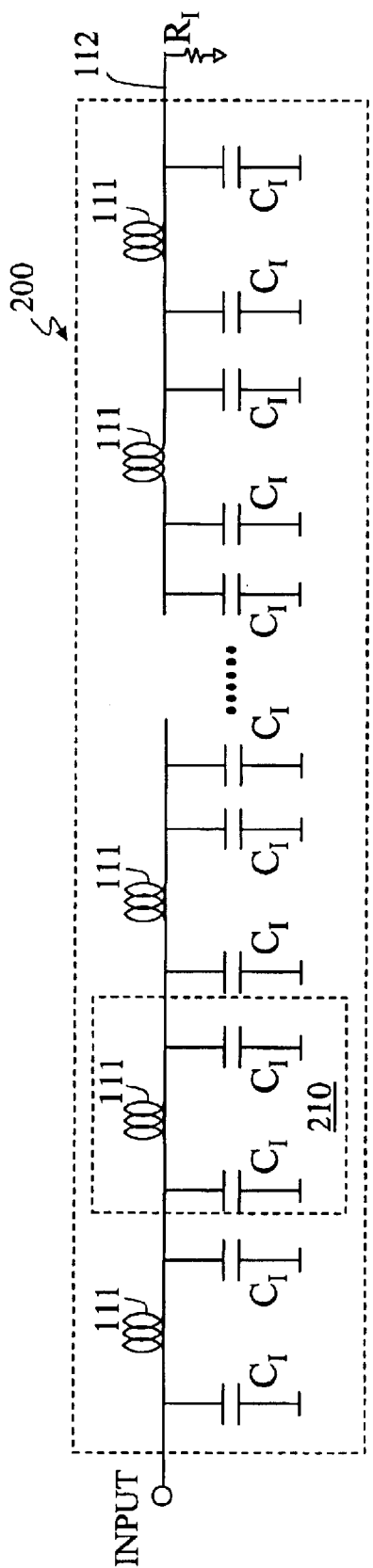
FIG. 3A
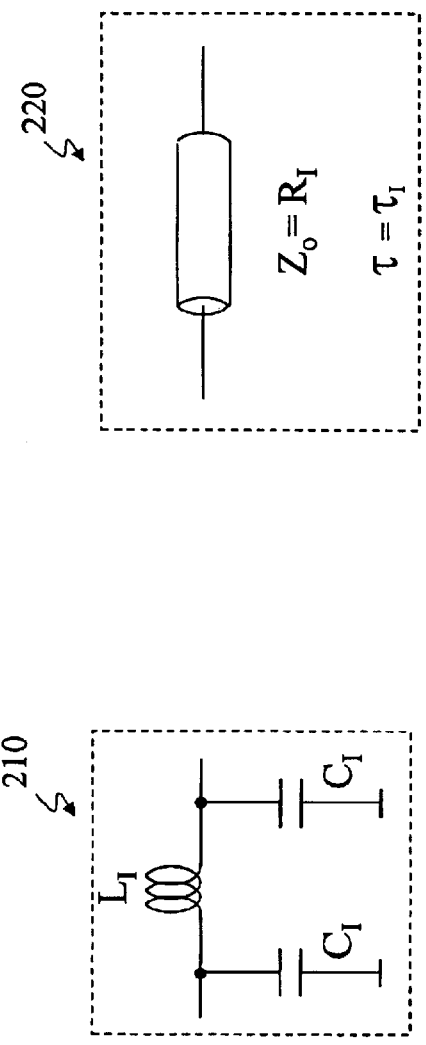
FIG. 3B
FIG. 3C

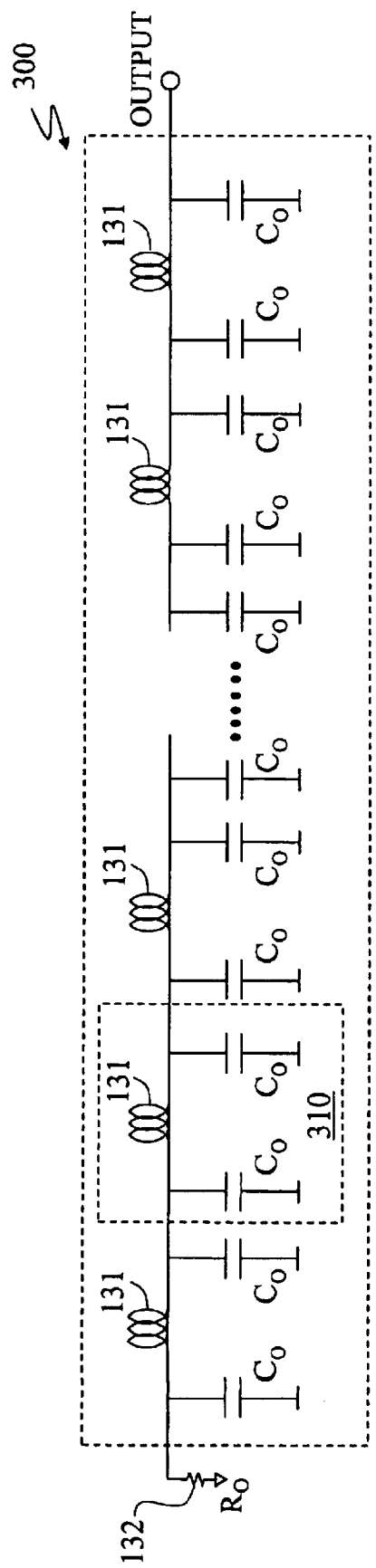
FIG. 4A
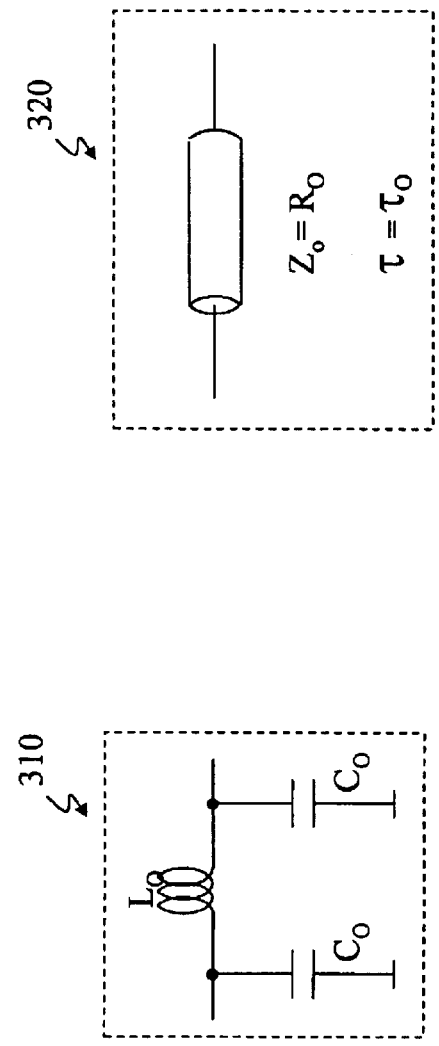
FIG. 4C
FIG. 4B

US 6,747,511 B1

DISTRIBUTED AMPLIFIER WITH PI-CONFIGURATION ANALYSIS AND SYNTHESIS LINES

CROSS REFERENCE TO RELATED APPLICATIONS

This application claims priority from the following U.S. Provisional Patent Application, the disclosure of which is incorporated by reference in its entirety for all purposes: U.S. Provisional Patent Application Ser. No. 60/292,487, Cheh-Ming Jeff Liu and Neng-Haung Sheng entitled, "DISTRIBUTED AMPLIFIER WITH PI-CONFIGURATION ANALYSIS AND SYSTHESIS LINES," filed May 21, 2001.

BACKGROUND

1. Field of Invention

The present invention relates to distributed amplifiers and, in particular, distributed amplifiers suited for wide-band and high-power applications.

BACKGROUND

2. Description of Prior Art

Distributed amplifiers are widely used in part to overcome the gain-bandwidth limitation due to inherent capacitance of the active devices associated with the resistive loads. Inductors and transmission lines are commonly employed to resonate with the device capacitance. The combinations of inductors and capacitors are approximately equivalent to delay elements (e.g., transmission lines) and thereby increase the operational bandwidth. FIG. 1A shows a conventional distributed amplifier 10 comprised of an analysis module 20, a gain module 30 and a synthesis module 40. The gain elements of the gain module 30 are identical and uniformly distributed in conjunction with the inductors. An equivalent-circuit model of an elementary section 50 of the distributed amplifier 10 is shown in FIG. 1B. The elementary section 50 is composed of two series inductors 51 and 52, and a shunt capacitance 53 in the format of a T-configuration. The inductors 51 and 52 are the inductors in the analysis 20 or synthesis module 40, while the capacitor 53 represents the device capacitance at the input or the output of the gain element. As the operation frequencies are lower than the resonance frequency of the components 51, 52, and 53, the elementary section 50 is approximately equal to a piece of transmission line 60 as shown in FIG. 1C. Virtually, a transmission line is a delay element with infinite bandwidth. Therefore, by combining device's capacitance 53 with the inductors 51 and 52 into a transmission line 60, amplifiers with these types of analysis module and synthesis module can be operated over very wide frequency range. However, for the integrated circuit, the size of the inductor is comparably larger than the one for an active gain element. Moreover, the inductors in the analysis and synthesis modules are of two values, L and L/2, where L/2 is the inductance value on one arm of the T-configuration. This increases the complexity of the resulting design and implementation of the conventional analysis and synthesis modules. A simple architecture for the analysis and synthesis modules of the distributed amplifier is desirable and provided by the present invention.

SUMMARY OF THE INVENTION

The present invention is embodied as a circuit for a distributed amplifier where the analysis and synthesis lines are implemented in formats of a new π-configuration. In accordance with a preferred embodiment of the present invention, the connection of the inductors and the capacitive devices is in a format of a π-configuration, that is, two shunt device capacitances with a series inductor. The number of inductors is less by two than the number associated within a conventional distributed amplifier, in which the connection is in a format of a T-configuration. Moreover, according to the present invention, all the inductances of the synthesis, or analysis, lines are of the same value as opposed to the two different values in a conventional distributed amplifier. This sameness of value of the inductances is also present in the analysis lines of the present invention.

A distributed amplifier, according to the present invention, features compactness of integration and less complexity in designing the analysis and synthesis modules.

BRIEF DESCRIPTION OF THE DRAWINGS

For a more complete understanding of the present invention and for further features and advantages, reference is now made to the following description taken in conjunction with the accompanying drawings, in which:

FIGS. 3A, 3B and 3C respectively illustrate equivalent-circuit models for the input circuit of the present invention, an elementary section and its equivalence;

FIGS. 4A, 4B and 4C respectively illustrate equivalent-circuit models for the output circuit of the present invention, an elementary section and its equivalence.

DETAILED DESCRIPTION

Figure 2:
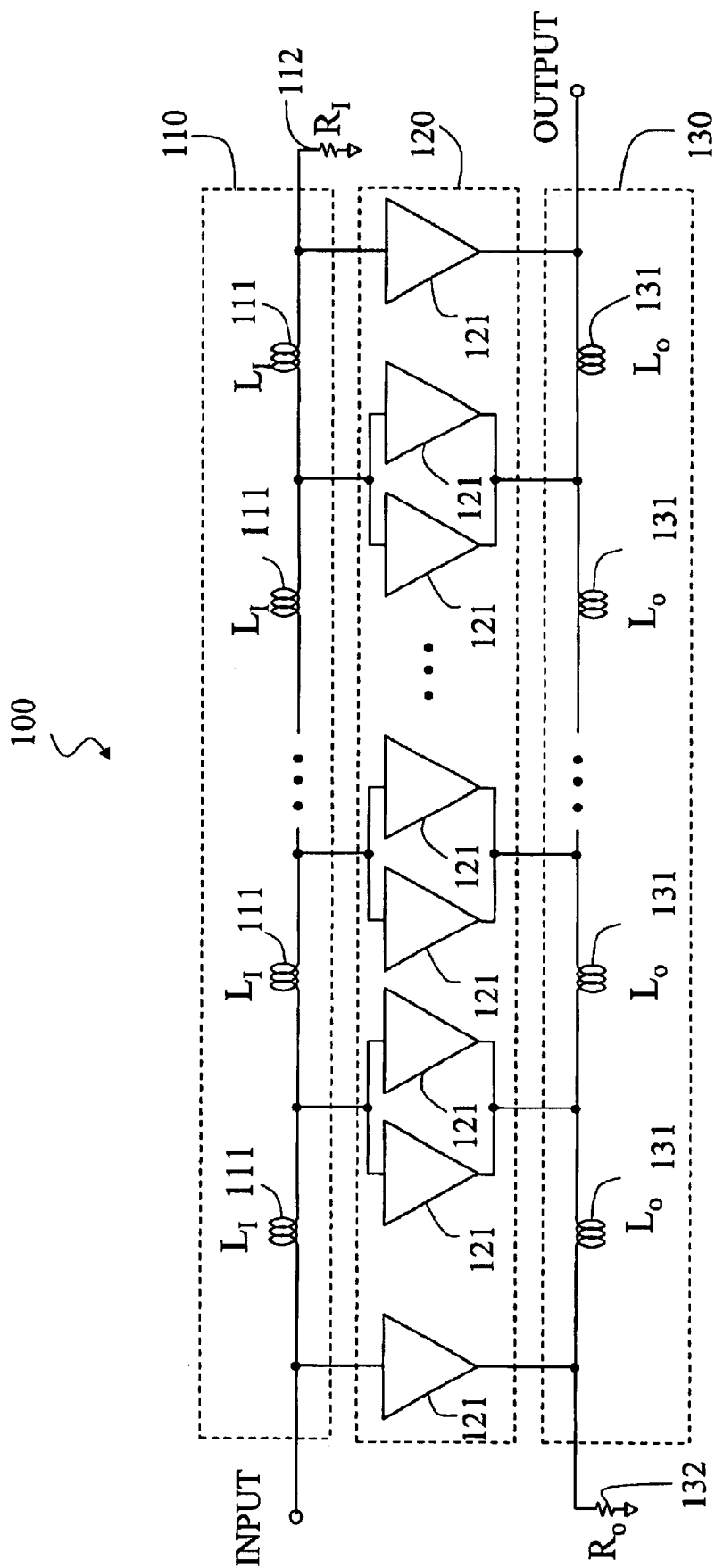
FIG. 2 illustrates the circuitry of a preferred embodiment of the present invention.

FIG. 2 shows a preferred embodiment of the present invention in which a distributed amplifier 100 consists an analysis module 110, the gain module 120 and a synthesis module 130. The analysis module 110 consists of N identical, or substantially similar, inductors 111 of a value $L_I$ and is terminated with a load 112 of a value $R_I$ at one end. The gain module 120 is composed of 2N identical, or substantially similar, gain elements 121. The synthesis module 130 consists of N identical, or substantially similar, inductors 131 of a value $L_o$ and is terminated with a load 132 of a value $R_o$ at one end.

FIG. 3A shows an equivalent-circuit model 200 for the analysis module 110 and the input of the gain module 120. The input of each of a plurality of gain elements is characterized by an equivalent capacitor $C_r$. The inductance $L_I$ is designed to satisfy the equation:

$$R_I = \sqrt{\frac{L_I}{2C_I}} \qquad [1]$$

Figure 1:
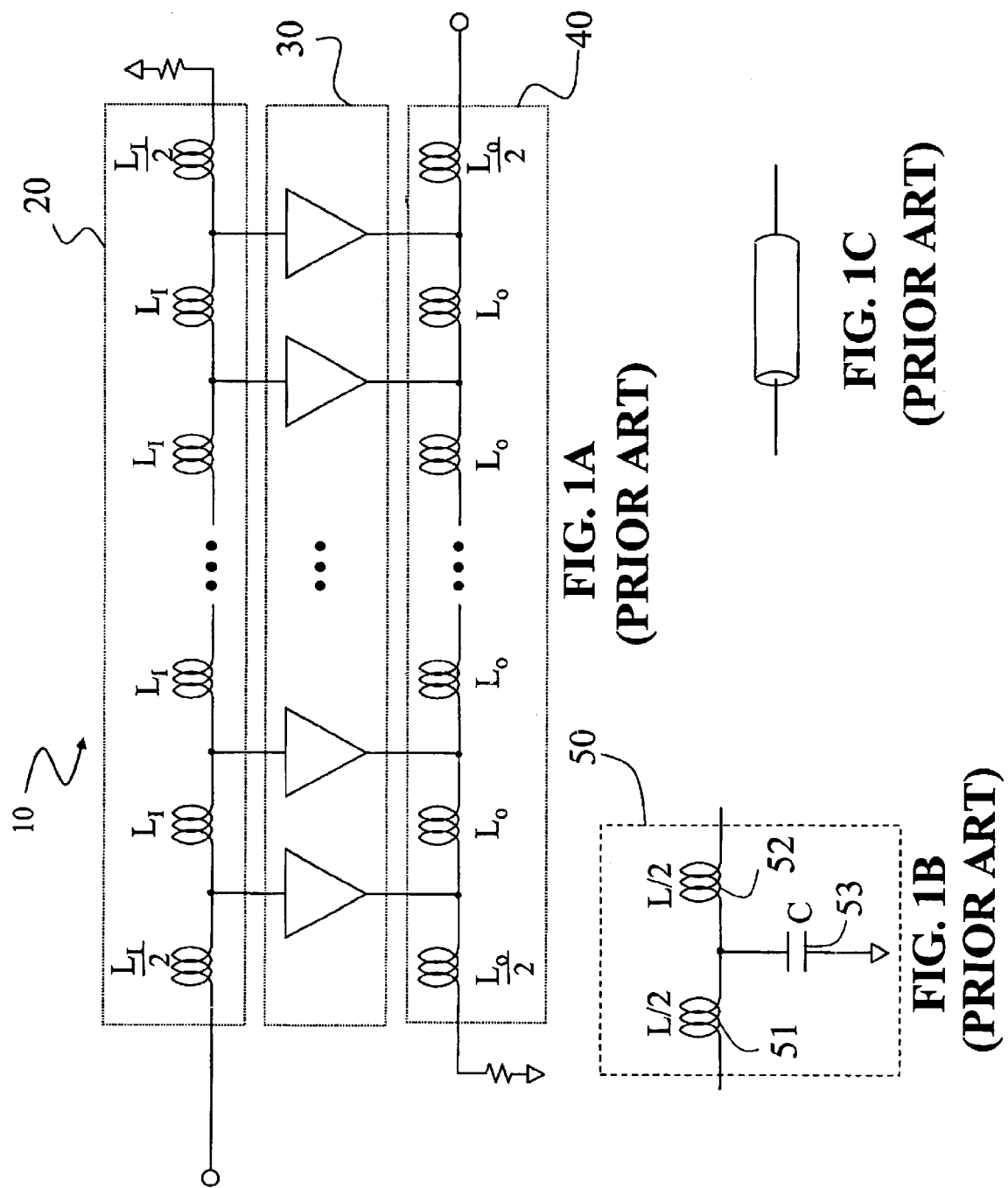
FIGS. 1A, 1B and 1C illustrate prior art of distributed amplifiers.

FIG. 3B shows a representative input elementary section 210 of the analysis module 110 and the input of the gain module 120. The input elementary section 210 is of a π-configuration as opposed to a T-configuration delay element 50, as shown in FIG. 1B, which is used in conventional distributed amplifiers. The input elementary section 210 is approximately equivalent to a segment of transmission line 220, as shown in FIG. 3C, with a characteristic impedance of $R_I$ and a delay of $\tau_I = \sqrt{L_I \cdot 2C_I}$. This approximation is valid and effective so long as the operational frequencies are much less than $1/(2\pi\tau_I)$. With the distributed π-configuration of 200, all inductors are of the same value and the number of inductors is reduced by two as compared to the conventional distributed amplifiers (FIG. 1A.)

FIG. 4A shows an equivalent-circuit model 300 for the synthesis module 130 and the output of the gain module 120. The output of each of a plurality of gain elements is characterized by a capacitor $C_o$. Similarly, the inductance $L_o$ is designed to meet the equation:

$$R_O = \sqrt{\frac{L_O}{2C_O}} \quad [2]$$

FIG. 4B shows a representative output elementary section 310 of the synthesis module 130. The output elementary section 310 is composed of two output-equivalent capacitors $C_o$ of gain elements symmetrically in conjunction with an inductor $L_o$ of synthesis module 130 in a format of a π-configuration. The output elementary section 310 is approximately equivalent to a piece of transmission line with a characteristic impedance of $R_o$ and a delay of $\tau_o = \sqrt{L_o \cdot 2C_o}$ as the operation frequencies are much less than $1/(2\pi\tau_o)$. In order to reduce the phase distortion due to the different delays between the analysis modules 110 and the synthesis module 130, the gain element of gain module 120 is designed to minimize the difference of $\tau_I$ and $\tau_o$.

Detailed Description of an Alternative Embodiment

Figure 5:
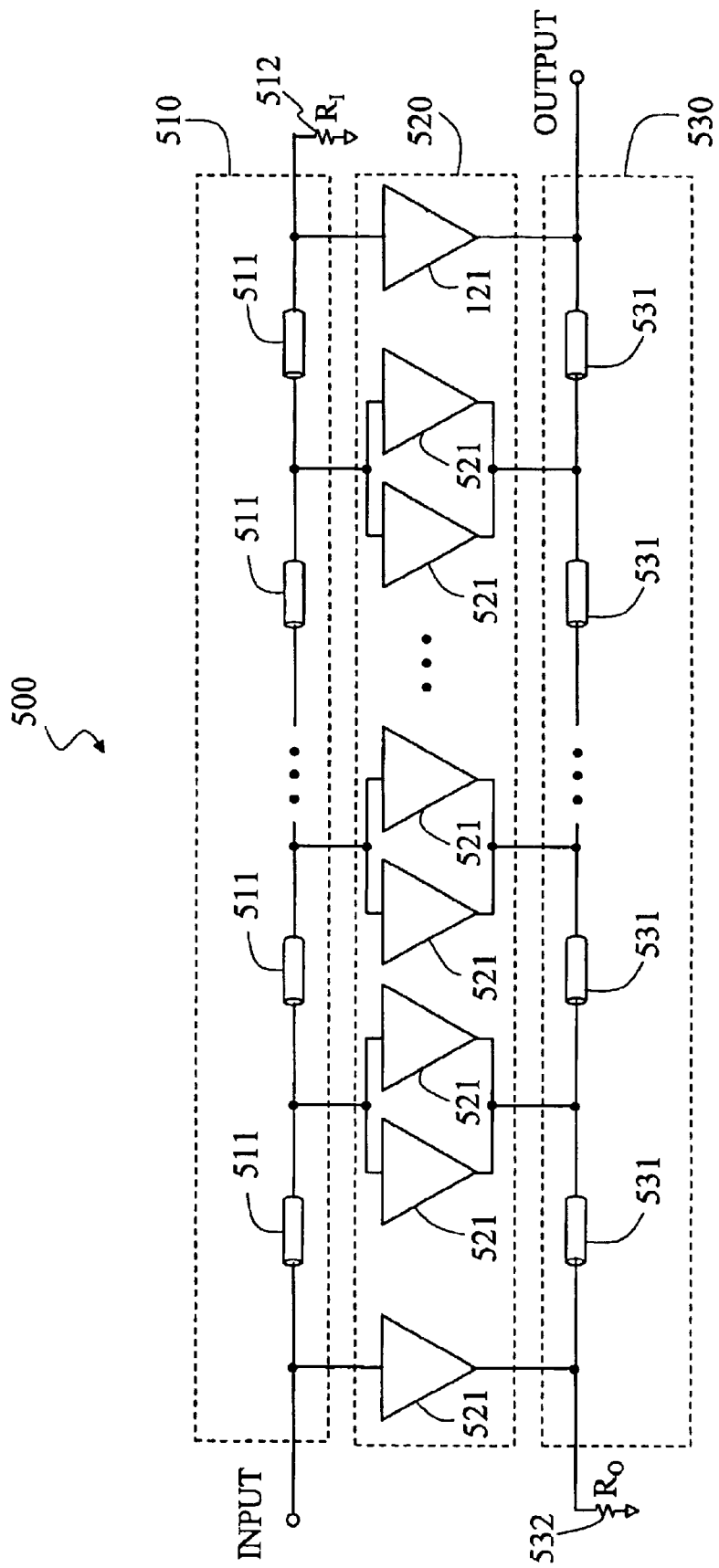
FIG. 5 illustrates an alternative embodiment of the present invention.

FIG. 5 shows an alternative embodiment of the present invention. The distributed amplifier 500 consists of an analysis module 510, a gain module 520 and a synthesis module 530. The analysis module 510 consists of a plurality of N identical transmission lines 511 and is terminated with a load 512 at one end. The gain module 120 is composed of a plurality of 2N identical gain elements 521. The synthesis module 530 consists of N identical transmission lines 531 and is terminated with a load 532 at one end.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

What is claimed is:

1. A distributed amplifier comprising:
  a. an analysis module for receiving and analyzing an input signal and transmitting said input signal to a gain module via at least one elementary section of said analysis module in a pi-configuration;
  b. said gain module for amplifying said analyzed signal and transmitting the amplified analyzed signal to a synthesis module; and
  c. said synthesis module for receiving the amplified analyzed signal via at least one elementary section of said synthesis module in a pi-configuration, wherein: the analysis module comprises N inductors of substantially similar value, the analysis module being terminated with a load at one end; the gain module comprises 2N gain substantially similar gain elements; the synthesis module comprises N inductors of a similar value, the synthesis module being terminated with a load at one end; the analysis module elements being connected with the input of the gain module elements in an equivalent circuit π-configuration of two shunt device capacitances with a series inductor wherein each representative capacitance is equal to half the inductance divided by the square of the input load; and the synthesis module elements being connected with the output of the gain module elements in an equivalent circuit π-configuration of two shunt device capacitances with a series inductor wherein each representative capacitance is equal to half the inductance divided by the square of the output load.

2. A distributed amplifier comprising:
  a. a gain module comprising 2N gain elements wherein each of the 2N gain elements have an input portion, an output portion, substantially similar gain values, substantially similar input capacitances and substantially similar output capacitances and wherein the gain elements between a first and a last gain element of the 2N gain elements are associable in pairs;
  b. An analysis module comprising N input delay elements wherein each of the N input delay elements have substantially similar values, and wherein:
    i. said N input delay elements are electrically connected in series;
    ii. each of the N input delay elements comprises a first node and a second node;
    iii. a first node of a first input delay element of the N input delay elements is electrically connected to an input of a first gain element of the 2N gain elements and is electrically connected to receive one or more input signals of said distributed amplifier;
    iv. a second node of said first input delay element of the N input delay elements is electrically connected to a fist node of a second input delay element of the N input delay elements and the input portion of the second gain element of the 2N gain elements and the input portion of the third gain element of the 2N gain elements;
    v. a second node of the Nth input delay element of the N input delay elements is electrically connected to an input portion of the 2Nth gain element of the 2N gain elements and an input load; and vi. a second node of each of the input delay elements of the N input delay elements between the first and the Nth input delay elements is electrically connected to a first node of a successive input delay element of the N input delay elements and electrically connected to the input portions of each of an associable pair of gain elements of the 2N gain elements; and c. a synthesis module comprising N output delay elements wherein each of the N output delay elements have substantially similar values and wherein:
  i. said N output delay elements are electrically connected in series;
  ii. each of the N output delay elements comprises a first node and second node;
  iii. a first node of a first output delay element of the N output delay elements is electrically connected to an output of the first gain element of the 2N gain elements and is electrically connected to an output load;
  iv. a second node of the first output delay clement of the N output delay elements is electrically connected to a first node of a second output delay element of the N output delay elements and the output portion of the second gain element of the 2N gain elements and the output portion of the third gain element of the 2N gain elements;
  v. a second node of the Nth output delay element of the N output delay elements is electrically connected to an output portion of the 2Nth gain element of the 2N gain elements whereby the second node of the Nth output delay element generates a distributed amplifier output signal; and
  vi. a second node of each of the output delay elements of the N output delay elements between the first and the Nth output delay elements is electrically connected to a first node of a successive output delay clement of the N output delay elements and electrically connected to the output portions of each of an associable pair of gain elements the 2N gain elements.

3. The distributed amplifier as claimed in claim 2 wherein the N input delay elements are inductors and the N output delay elements are inductors.

4. The distributed amplifier as claimed in claim 2 wherein the N input delay elements are transmission lines and the N output delay elements are transmission lines.

* * * * *